United States Patent [19]

Pistor

[11] Patent Number: 4,687,886
[45] Date of Patent: Aug. 18, 1987

[54] CAM ACTIVATED PRINTED CIRCUIT BOARD MULTICIRCUIT ELECTRICAL SWITCH

[75] Inventor: Helmut H. Pistor, Fairfax, Va.

[73] Assignee: The United States of America as represented by the Secretary of the Army, Washington, D.C.

[21] Appl. No.: 783,703

[22] Filed: Oct. 3, 1985

Related U.S. Application Data

[62] Division of Ser. No. 605,960, May 1, 1984, Pat. No. 4,560,220.

[51] Int. Cl.⁴ ............................................. H01H 19/00
[52] U.S. Cl. .................................. 200/6 B; 200/27 R; 200/38 C; 200/153 LB; 200/292
[58] Field of Search .............. 200/1 R, 5 R, 5 A, 6 B, 200/6 BA, 6 BB, 6 C, 8 R, 11 R, 27, 30 R, 37, 38 R, 38 B, 38 C, 153 L, 153 LA, 153 LB, 238, 239, 283, 292; 361/398; 174/35 TS; 339/17 LM

[56] References Cited

U.S. PATENT DOCUMENTS

| | | | |
|---|---|---|---|
| 2,229,585 | 1/1941 | Osenberg | 174/35 TS X |
| 3,330,917 | 7/1967 | Grundfest | 200/8 R X |
| 4,046,980 | 9/1977 | Rosebrock | 200/38 B X |
| 4,204,098 | 5/1980 | Strande | 200/1 R |
| 4,412,272 | 10/1983 | Wedertz et al. | 361/398 X |
| 4,472,609 | 9/1984 | Lamm et al. | 361/398 X |
| 4,609,240 | 9/1986 | Pistor | 339/17 LM |

*Primary Examiner*—James R. Scott
*Attorney, Agent, or Firm*—Max L. Harwell; Milton W. Lee; Anthony T. Lane

[57] ABSTRACT

A cam activated electrical switching means for an elastic multicircuit printed circuit board (PCB). A plurality of PCB reeds with disattached portions at one end nearest the edge of the PCB are cut out in the generally central portion of the PCB, and an electrical board, positioned adjacent to but separated from the PCB, made of elastic PCB-type material has the same number of plurality of flexible reeds cutout therefrom in its central portion. The PCB reeds and electrical board flexible reeds have electrical leads etched on the back sides thereof with the PCB reeds having an electrical contact pin on the front of the disattached end portion facing the etched electrical lead on the back of the disattached end of the flexible reed. An embossed mechanical rider is positioned on the front of the disattached end of the flexible reeds. The electrical etched lead on the back of the flexible reed may be connected to some electrical source on the electrical board. The electrical contact pin is electrically connected through the PCB reed to the etched lead on the back of the PCB reed which is further electrically connected to an electrical component etched on the back of the PCB. The normally open pairs of disattached end portions of the interfacing PCB and flexible reeds are selectively closed by a rotatable cam having selective lobes on its circumference which contacts the embossed mechanical riders and flexes the flexible reeds against the PCB reeds to selective switch the electrical source to electrical components.

1 Claim, 11 Drawing Figures

CAM ACTIVATED PRINTED CIRCUIT BOARD MULTICIRCUIT ELECTRICAL SWITCH

The invention described herein may be manufactured, used, and licensed by the U.S. Government for governmental purposes without the payment of any royalties thereon.

This application is a division of parent U.S. application Ser. No. 605,960, filed May 1, 1984, now U.S. Pat. No. 4,560,220 and sister to division U.S. application Ser. No. 783,889, filed Oct. 3, 1985, now U.S. Pat. No. 4,609,240.

BACKGROUND OF THE INVENTION

1. Field of the Invention

The invention relates to printed circuit board (PCB) electrical connectors, and more specifically to connect-/disconnect multichannel electrical connectors or multicircuit electrical switches that use the elasticity of PCB material and cutouts to form reeds with disattached end portions thereon wherein contact pressure is provided and/or maintained between contact points on the disattached ends of the elastic reeds on adjacent PCB electrical connectors or on PCB and electrical boards adjacent to and electrically separated from the PCB.

2. Description of the Prior Art

Prior art PCB connectors required the addition of springs to maintain contact pressure. Spring clips, known as parrot clips, have been used to hold connectors and circuit boards together under contact pressure.

Conventional connectors require contact points to be concentrated in a small rea to minimize the plug size, weight, and cost. The precision this entails is achieved with precisely molded connector bodies to which metal spring connectors are assembled. Usually, the body is assembled into an element which guides, i.e. keys, and holds the assembly and any harness associated therewith. The contact points may be soldered to a conductor. This technology requires extensive tooling, large volume, commonality design features, and considerable assembly cost to the original equipment manufacturer. Further, packaging must conform to common connectors, preferably catalog items. The present invention alleviates the above shortcomings of the prior art.

SUMMARY OF THE INVENTION

The present invention relates to multichannel electrical connectors contact clip means for maintaining contact pressure between electrical conductors both on and off a PCB, or between adjacent PCBs. The clip means may be comprised of a plurality of elastic PCBs and off-PCB electrical boards having contact points thereon preferably on disattached end portions of a plurality of reeds wherein the contact points on the off-PCB reeds may either provide direct electrical contact to the PCB contact points or function as an embossed mechanical rider portion interacting with a connect/disconnect means to bias electrical conductors on each reed of the off-PCB reed into electrical contact against the PCB electrical contact. The PCBs and reeds of all embodiments herein are preferably made of fiber glass, but may be made of other plastics, or may be phenolic boards. The cutout of the reeds may be made by a jewelers slitting saw, preferably made of carbon.

The plurality of elastic reeds may be formed by a plurality of elongated cutouts from PCBs and off-PCB electrical board reed plates with the contact points on one or both sides of the disattached end portions of each reed. The connect/disconnect means may vary according to the embodiment in which it is used. All of the connect/disconnect means however are used to selectively close and open conduction paths associated with the reeds.

In one illustrative embodiment of the invention, a compound PCB, preferably of two adjacent PCBs, is used in which each of a plurality of the reeds on a first PCB is exactly adjacent and matched with each of a plurality of reeds on the adjacent second PCB. The connect/disconnect means is comprised of a cam activated means, wherein lobes on a rotatable cam are selectively spaced according to a desired switching scheme for the plurality of reeds on the compound PCB. The plurality of reeds are illustrated as being cutout on the interior of the adjacent PCBs, but may be formed with the flexible ends of the reeds at the edges of the PCBs just as well.

In another illustrative embodiment, a plurality of PCB component boards may be mounted in a cabinet in individual racks wherein each PCB is slid into the cabinet over a rod which is a part of the cabinet chassis and which forms a fulcrum when the PCB is pulled back out and flexed downward. A plurality of reeds on each PCB are biased against a mother board when the PCB is flexed downward. The PCBs are then released upard against a rack edge connector at the front of the cabinet. Electrical contact is maintained between each PCB and the mother board as long as the PCB is held depressed in the rack edge connector. Electrical components may conveniently be mounted on each PCB. The mother boards preferably have contact pins interfaced with electrical contacts on the reeds of each PCB to maintain electrical contact.

Another illustrative embodiment of a connect/disconnect means is a phone jack type electrical connector wherein the jack is inserted between two cutout reeds on a PCB in which each reed has interfacing partial semicircular cutouts. When the phone jack is inserted between the semicircular cutouts each flexible reed is laterally expanded even after an enlarged head of the phone jack has been pressed therethrough and the two reeds have partially relax back into a smaller neck portion of the phone jack. The inside of the semicircular cutouts may be coated with a conductor material, such as gold covered nickel, to provide electrical conduction to electrical components on the PCB.

A multichannel test clip assembly, for example connected to one end of a multiconductor flat ribbon cable, is also illustratively shown and conforms to the same inventive concept of using the elasticity of PCB material for providing electrical contact between a PCB and other electical contacts. The clip assembly has a beveled spacer on the ribbon cable side onto which two PCB material flexible reed plates are mounted at about 6° angle toward each other, wherein one reed plate has a plurality of reeds with a contact pin at the end of each reed which is connectable to electrical components and the other reed plate has a plurality of reeds with self locking clip connector cutouts at the end of each reed for fitting over contact posts. The contact posts are electrically connected to other electrical components. The clip assembly is further comprised of a slidable spreader which is slidable between the reed plates from the spacer almost to the end of both reeds. The spreader connects and disconnects the contact pins with the posts. The self locking clip connector cutouts of the assembly may be easily pulled out or pressed onto the contact posts when the spreader separates the contact pins from the contact posts.

Another illustrative embodiment of the present multichannel clip connect/disconnect means is by ramp activated means wherein two normally separated reed boards may be pressed into a wedge of a cabinet or the like (not shown) to provide electrical contact between electrical components and conductors on the two reed boards. Electrical contact is automatically removed by removing the multichannel clip from the wedge.

A non-locking plunger may also be used to press reeds with contact pins thereon onto a mother board to provide selective electrical contact to electrical components, in which the pins are automatically released when the plunger is released.

DETAILED DESCRIPTION OF THE PREFERRED EMBODIMENTS

Figure 1:
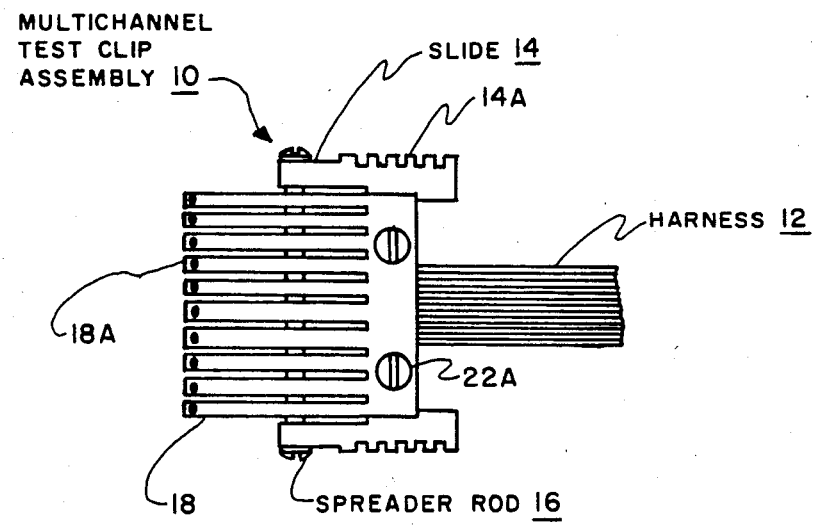
FIGS. 1, 2, 3, and 4 are illustrative views of a multichannel harness assembly embodiment of the invention.
Figure 2:
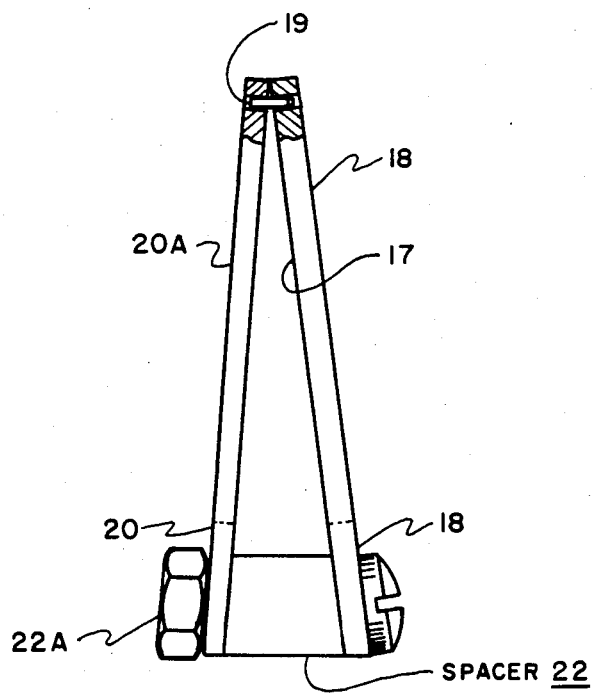
Figure 3:
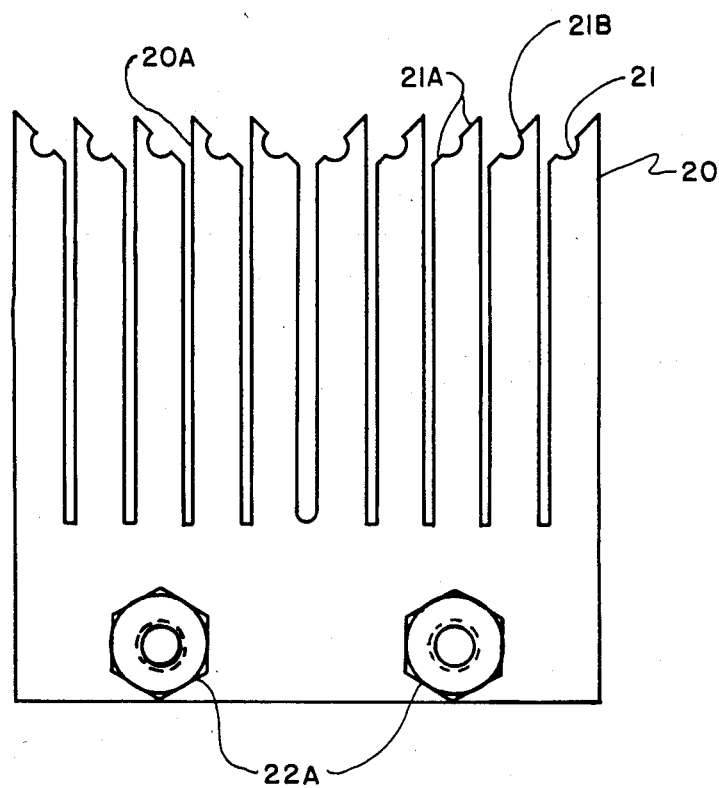
Figure 4:
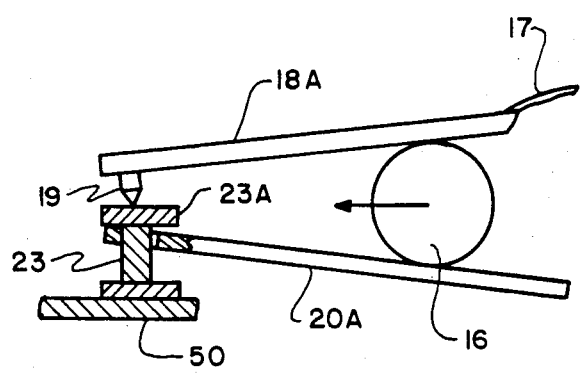

Refer now to FIGS. 1-4 for a means of securing a multichannel contact clip assembly 10 to a plurality of posts 23 on a PCB with only one post 23 shown on a cutaway of a PCB 50 in FIG. 4. Assembly 10 provides electrical connections between a wiring harness 12 and a plurality of contact pins 19 connected to the plurality of posts 23 on the PCB 50. The posts may be positioned on the edge of the PCB 50, but are not limited to that particular positioning. The posts 23 and pins 19 however, must be similarly spaced for the desired electrical contact therebetween.

The assembly 10 and its operation with a PCB 50 will become better understood by the following description. Assembly 10 is comprised of a contact pin reed plate 18 having a plurality of contact pin reeds 18A and a slot reed plate 20 having a plurality of slot reeds 20A. Plates 18 and 20 may be made of PCB type material and have parallel slits cut out to form the plurality of reeds 18A and 20A. The reeds, which may be made of fiber glass, have the flexibility appropriate for operation of assembly 10. Plates 18 and 20 are separated from each other at a base region by a spacer 22, and may be held securely against the spacer by screws 22A on each side of 22. The unattached ends of reeds 18A and 20A rest against each other if no stress is applied thereo. However, a spreader rod 16 connected to a slide mechanism 14 runs laterally between plates 18 and 20. Slide 14 has serrated ridges 14A thereon for providing a better grip for sliding rod 16 between plates 18 and 20.

Look at FIG. 3 for an illustration of one embodiment of the circular slots 21 of slot reed plate 20. Each reed 20A is comprised of a beveled end face 21A which has the circular slot 21 cut therefrom. Slot 21 has an upper lip 21B which locks over post 23 after each reed 20A has flexed laterally off the beveled edge 21A into the slot 21. Stated another way, each reed 20A has a slide probe outer end which has a friction lock contact with each post 23. The ten reeds 20A shown in FIG. 3 is a typical number, but is not limited thereto.

FIG. 4 further shows, in a partial illustration, how when spreader rod 16 is moved toward the ends of reeds 18A and 20A the pin 19 is separated from a conductive head 23A of the post 23. When reed 18A and 20A are spread apart by rod 16, the assembly 10 may be connected to post 23. The post may be slid across the beveled side 21A of reeds 20A and secured thereto by upper lip 21B by pressing assembly 10 forward or released by pulling back. Refer to FIG. 3 for a better understanding of how each of the plurality of posts 23 (not shown) being slightly offset up the beveled edge 21A from the circular slots 21 causes some side flexing of each reed 20A and thus a more secure fitting of the posts 23 within slots 21. When spreader rod 16 is pulled back the sharp point of pin 19 rests upon the conductive head 23A to complete the electrically conductive path. Conductive head 23A preferably has a hole in the center thereof that passes through the post 23 to electrical components on the PCB 50. A soft conductive solder may be placed in the hole on the conductive head 23A so that pin 19 easily penetrates the soft solder to provide a good electrical path between the PCB 50 electrical components and the electrical leads 17 back through the harness to the off PCB electrical components. Alternatively, the pin 19 may be a dual type wherein the two pins rest on the shoulders of the solder for better electrical contact.

The pins 19 are preferably made of brass tubing of about 0.062 inch outside diameter with a 30° beveled head down to a sharp point that makes good electrical connection with the solder on conductive head 23A. The wiring harness 12 may be loosely fit through the spacer 22 with the ends of the wiring connected to either the innermost or outermost portion of the reeds 18A according to where the electrical leads 17 are on the reeds 18A. The pins 19 may be soldered to the reeds 18A and in electrical contact with leads 17. The spreader rod 16 and slide mechanism 14 are preferably made of Delrin, or equivalent material. The original concept was for use with small post and pins as discussed above, but may also be used in larger configurations as long as the elastic electrical conductive boards and/or reeds are used.

Figure 5:
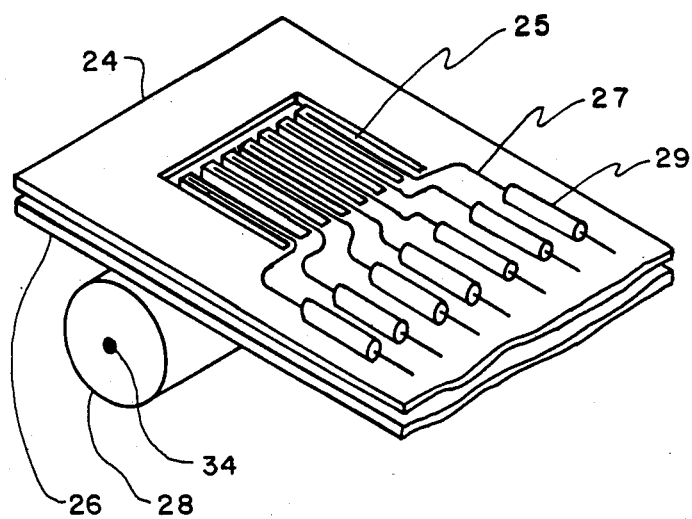
FIGS. 5 and 6 illustrate a cam activated connect/disconnect means for a multichannel PCB embodiment of the invention.
Figure 6:
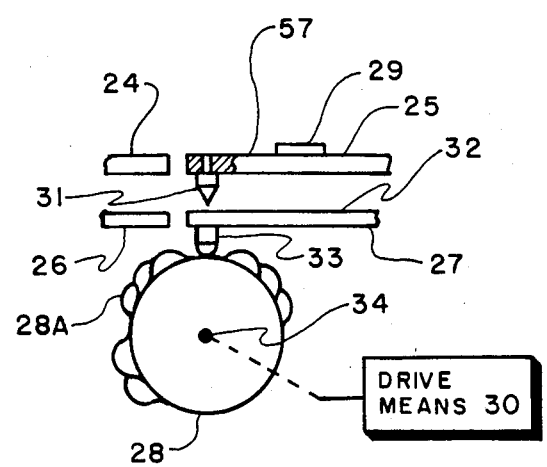

Refer to FIGS. 5 and 6 for an explanation of a cam activated electrical switching means for a multicircuit elastic printed circuit board (PCB), represented by 24, which has a plurality of reeds 25 with disattached portions at the end nearest the edge of the PCB cutout in the generally central interior portion thereof. An electrical board, represented by 26, made of elastic PCB type material has a plurality of flexible reeds 27 with disattached portions at one end cutout in the central interior portion thereof. Each of the plurality of PCB reeds 25 are exactly adjacent and matched with one each of the plurality of electrical board flexible reeds 27 with the disattached end portions directly opposite each other to form a plurality of paired PCB reeds and flexible reeds to define one switch of a plurality of switches.

Each PCB reed 25 has an electrical contact pin 31 on the front of the disattached end portion which faces toward an electrical conductor 32 etched on the back of the flexible reeds 27. Each reed 25 of board 24 has an electrical lead 57 leading to an electrical component 29 etched thereon. Each lead 57 provides an electrically conductive path between pin 31 and component 29. Board 26 is slightly separated from board 24 so that reeds 25 and 27 do not make electrical contact between each electrical contact pin 31 and the electrical conductor 32 on the back of reed 27 when an embossed mechanical rider 33, (shown exaggerated in FIG. 6) on the front of the disattached end portion of each reed 27 is not riding on one of a plurality of lobes 28A selectively positioned on a rotatable cylindrical cam 28. However, as cam 28 is rotated about its center 34 by a drive means 30, such as an electric motor, each lobe 28A is prearranged along the length of cam 28 to selectively flex the disattached end portions of one of the reeds 27 upward to complete electrical contact between a component 29 and some electrical source on the off-PCB electrical board 26 (not shown) connected to electrical conductor 32. Lobes 28A are shown as overlapping to illustrate that these lobes are selectively arranged down the length of cam 28. The adjacent PCB and electrical boards have respectively an equal numer of PCB reeds and electrical board flexible reeds in the stated plurality of PCB reeds and plurality of flexible reeds. Also each reed of the plurality of PCB reeds is paired and matched with an individual reed of the plurality of flexible reeds since they are interfacing. The pairings and functions of a PCB reed with a flexible reed is independent of any of the other reeds and is only changed from its normally open condition by the rotation of the one specifically associated lobes 28A on cam 28 that presses against the one specific embossed rider 33 to bias the flexible reed against the PCB reed and thus switch the one pair of matching PCB reed and flexible reed into a closed condition. A plurality of these switching conditions are simultaneously going on while the cam 28 is being rotated since each pairing of a PCB reed and a flexible reed is only associated with one of the lobes 28A, or even multiple lobes 28A which may be positioned only around that particular portion of the circumference of cam 28 which rotates by that particular pairing of PCB and flexible reeds.

Figure 7:
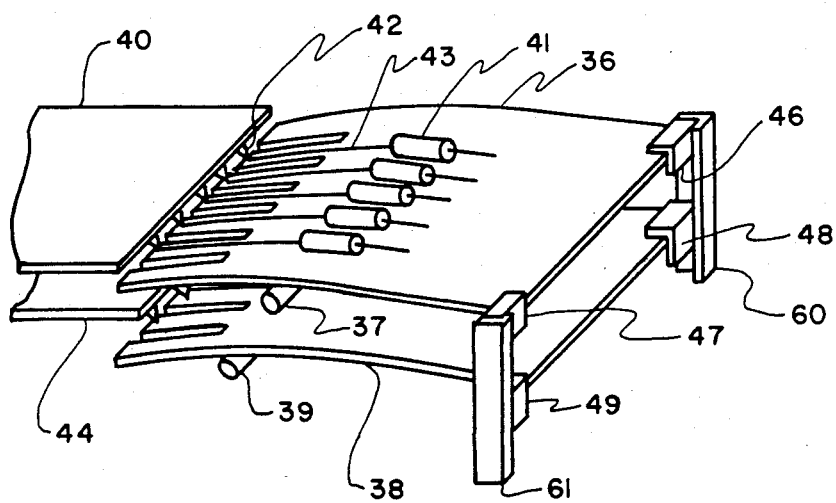
FIG. 7 is an illustrative diagram of a rack edge multichannel electrical connector embodiment of the invention.

FIG. 7 illustrates another embodiment of the invention in which the elastic multiple reeds are this time not cut out in the middle of a PCB, or component board, as in the cam actuated type but are cut out on one edge thereof. Each of a plurality of component boards, two of which are represented by numerals 36 and 38, may typically be mounted in a cabinet to a plurality of mother boards, or other boards two of which are shown by numerals 40 and 44 respectively connected to component boards 36 and 38. Look at component board 36 for an explanation of how each of the component boards operate, i.e., how elastic board 36 and a plurality of reeds 43 thereon are flexed to maintain electrical contact with a plurality of contact pins 42 on mother board 40. Component board 36 is first inserted into the cabinet from right to left between cabinet channels 60 and 61 and over an elongated rigid bar 37 and under the plurality of contact pins 42 on the mother board 40, in which the rigid bar and mother board are a part of the cabinet. Board 36 is then pressed down on bar 37 and is pulled back under rack edge connectors 46 and 47 which are rigidly attached to channels 60 and 61. The reeds 43 will be flexed against pins 42 to provide electrical conduction between the mother board 40 and a plurality of electrical components 41 on component board 36. The second component board 38 also has its reeds flexed against contact pins on the mother board 44 by the board 38 being flexed over elongated rigid bar 39 and secured under rack edge connectors 48 and 49. There may be many more component and mother boards connected in this fashion.

Figure 8:
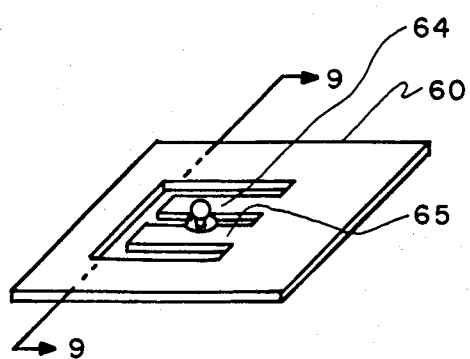
FIG. 8 schematically shows a phone jack flexible connector embodiment of the invention.
Figure 9:
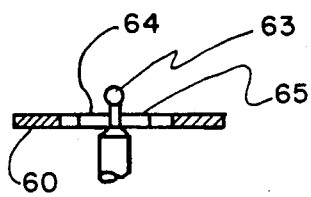
FIG. 9 illustrates a cutaway through sectional line 9—9 of FIG. 8.

FIGS. 8 and 9 illustrate the use of elastic reeds as electrical connect/disconnect means for a phone type jack. FIG. 9 illustrates a cutaway of sectional line 9—9 of FIG. 8. Each phone jack 63 may be inserted between interfacing semicircular cutouts (shown exaggerated in FIG. 8) of reeds 64 and 65 on a component board 60. The semicircular cutouts on reeds 64 and 65 are of a slightly smaller diameter than the head and neck of the phone jack 63 so that when jack 63 is inserted between the cutouts, the elasticity of reeds 64 and 65 allow the reeds to move apart and yet the strength of reeds 64 and 64 keep the reeds biased back against the neck of jack 63 to provide good contact therebetween. The inside of the semicircular cutouts have electrical conductor material, such as gold covered nickel, therein that connects to an electrical circuit (not shown).

Figure 10:
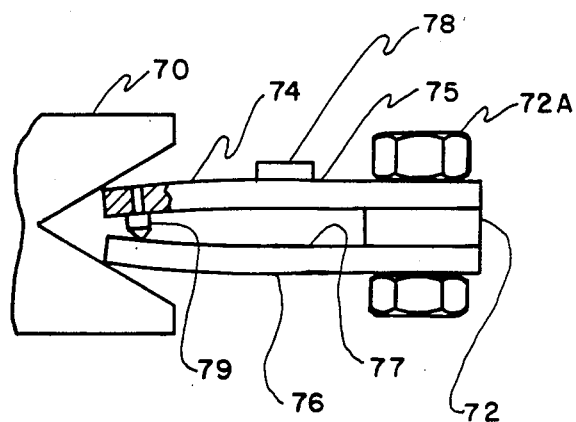
FIG. 10 is a sideview schematic of a ramp activated multiple reed electrical connector.

The configuration of FIG. 10 may be another cabinet type mounting embodiment. A reed structure holds two reed boards having a plurality of reeds 74 and 76 normally separated from each other by a spacer 72. The two reed boards may be separated by and held firmly to spacer 72 by bolts 72A running therethrough. The reed structure has a contact pin 79 on reed 74 which contacts electrical conductor 77 laid on reed 76 with an electrical component 78 and lead wires 75 therefrom laid on reed 74 when the reed structure is pressed into a ramp structure 70. Ramp structure 70 may be part of a cabinet. Conductor 77 may be attached to electrical ground or some voltage source, or the like (not shown).

Figure 11:
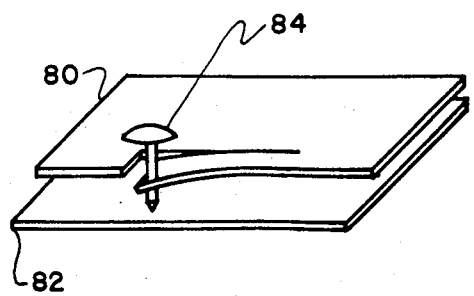
FIG. 11 illustrates a reed plunger activated electrical component board.

FIG. 11 illustrates a single edge type reed on the side of a reed component board 80. The reed may be a single reed on the edge of the board 80, as shown, or a plurality of reeds around the edge of board 80. A hold-down plunger 84 may be used as a connect/disconnect means for each reed in this embodiment. A second component board 82, i.e. a solid component board, interfaces board 80 and has electrical conductors thereon (not shown) to connect with electrical components (not shown) on board 80 very similar to that shown by FIG. 10.

I claim:
1. A cam activated multicircuit electrical switch for selectively switching an electrical source to a plurality of electrical components on a multichannel printed circuit board (PCB), said multicircuit electrical switch comprised of:
an elastic PCB having a plurality of elastic PCB reeds with disattached portions at one end cutout therefrom in the generally central interior portion of said elastic PCB, each of said elastic PCB reeds having an electrical lead etched on the back thereof which leads to one of a plurality of etched electrical components on the back of said PCB and each of said elastic PCB reeds having an electrical contact pin pointing outward from the front of the disattached end portion and electrically connected through the elastic PCB reed to said etched electrical lead on the back thereof;
an electrical board made of elastic PCB-type material positioned adjacent to and slightly separated from said PCB, the elastic electrical board having a plurality of flexible reeds with disattached portions at one end cutout therefrom in the generally central interior portion of said elastic electrical board in which said plurality of flexible reeds are interfacing and matching said plurality of PCB reeds in which said disattached end portions of said flexible reeds and said PCB reeds are exactly adjacent each other and each of said flexible reeds having an electrical conductor etched on the back thereof which is electrically connected to an electrical source on said electrical board and each of said flexible reeds having an embossed mechanical rider on the front of said disattached end portion, wherein said electrical contact pin on the front disattached end portion of said PCB reed interfaces with said etched electrical conductor on the back of said disattached end portion of said flexible reed; and a rotatable cylindrical cam switching means, said cylindrical cam switching means having an outer surface extending down the length of the front surfaces of said plurality of embossed mechanical riders on the disattached end portions of said flexible reeds, said cylindrical cam having a plurality of lobes selectively positioned thereon in which said lobes are grouped along the circumference of the cam to be associated with individual pairs of flexible reeds and the interfacing PCB reeds to define one switch of a plurality of switches formed by the plurality of paired flexible and PCB reeds such that as each lobe on said cylindrical cam is rotated by each individual paired flexible and PCB reeds the lobe rotates against said embossed mechanical rider wherein the pressure exerted on said rider biases said flexible reed disattached end portion against said electrical contact pin on said PCB reed to switch the electrical source on said electrical board through said contact pin and said electrical lead etched on the back of said PCB reed to said electrical component on the back of said PCB.

* * * * *